US005345115A

United States Patent [19]
Tokuda et al.

[11] Patent Number: 5,345,115
[45] Date of Patent: Sep. 6, 1994

[54] SUPERCONDUCTING INPUT INTERFACE CIRCUIT FOR SUPERCONDUCTING CIRCUIT

[75] Inventors: Hitoki Tokuda; Michitomo Iiyama, both of Osaka, Japan

[73] Assignee: Sumitomo Electric Industries, Ltd., Osaka, Japan

[21] Appl. No.: 53,207

[22] Filed: Apr. 28, 1993

[30] Foreign Application Priority Data

Apr. 28, 1992 [JP] Japan .................................. 4-136016

[51] Int. Cl.⁵ .......................................... H03K 19/017
[52] U.S. Cl. .................... 505/193; 307/462; 307/245; 307/306; 307/475; 307/476; 257/39; 505/701; 505/220
[58] Field of Search ...................... 257/33, 39; 307/462, 307/476, 475, 264, 245, 306; 505/1, 701

[56] References Cited

U.S. PATENT DOCUMENTS

| 5,010,304 | 4/1991 | Mueller et al. | 330/269 |
| 5,024,993 | 6/1991 | Kroger et al. | 505/1 |
| 5,231,295 | 7/1993 | Tye et al. | 257/39 X |
| 5,236,896 | 8/1993 | Nakamura et al. | 257/39 X |
| 5,240,906 | 8/1993 | Bednorz et al. | 505/1 |
| 5,250,506 | 10/1993 | Saitoh et al. | 505/1 |

FOREIGN PATENT DOCUMENTS

| 0344925 | 12/1989 | European Pat. Off. | |
| 0480814 | 4/1992 | European Pat. Off. | |
| 3308974 | 12/1988 | Japan | 257/39 |
| 2000391 | 1/1990 | Japan | 257/39 |

OTHER PUBLICATIONS

IBM Technical Disclosure Bulletin, vol. 19, No. 4, Fang et al, pp. 1461–1462, Sep. 1976.
IBM Technical Dislosure Bulletin, vol. 19, No. 4, Fang et al, p. 1463 Sep. 1976.
Applied Physics Letters, vol. 49, No. 17, Muhlfelder et al, pp. 1118–1120, Oct. 27, 1986.

*Primary Examiner*—David R. Hudspeth
*Attorney, Agent, or Firm*—Kerkam, Stowell, Kondracki & Clarke

[57] ABSTRACT

A superconducting interface circuit converting a signal sent from a normal conducting circuit into a small voltage swing signal suitable for a superconducting circuit includes a superconducting field effect device. The superconducting field effect device has a superconducting channel of an extremely thin oxide superconductor thin film, a superconducting source region and a superconducting drain region of an oxide superconductor thin film positioned at both ends of the superconducting channel, and a gate electrode on the superconducting channel through a gate insulator. The gate electrode of the super-FET is connected to a signal line which transmits a voltage signal from the normal conducting circuit.

7 Claims, 2 Drawing Sheets

SUPERCONDUCTING INPUT INTERFACE CIRCUIT FOR SUPERCONDUCTING CIRCUIT

BACKGROUND OF THE INVENTION

1. Field of the Invention

The present invention relates to a superconducting input interface circuit for a superconducting circuit, and more specifically to a superconducting interface circuit which transform a signal sent by an ordinary electronic circuit to a suitable signal for a superconducting circuit.

2. Description of related art

When a superconducting device or a superconducting integrated circuit is adapted to an electronic equipment, it needs to be associated with a conventional electronic circuit operating at an ordinary temperature, since it is still impossible for the superconducting device or the superconducting integrated circuit to complete the entire electronic equipment.

Owing to the real nature of superconducting phenomena, such as problems of cooling etc., superconducting devices utilized in conventional electronic equipment are limited to a switching device and a sensor device including a Josephson junction, a resistor, a capacitor and an inductor. Therefore, a complicated circuit still can not be composed of only the superconducting devices alone. Moreover, the superconducting circuit has a small voltage swing range less than a few millivolts. By this, a weak signal of a few millivolts or a few microvolts is transferred through the superconducting circuit.

In the prior art, in order to transmit a signal of several volts from an ordinary electronic circuit to the superconducting circuit, the signal should be converted to have a voltage swing of a few millivolts or a few microvolts by a normal conducting interface circuit, and then this small voltage swing signal is sent to the superconducting circuit cooled by liquid nitrogen or liquid helium.

This small voltage swing signal sent to the superconducting circuit from the interface circuit is easily affected and disturbed by external electromagnetic waves. Therefore, multiplexing and coding of the small voltage swing signal are restricted so as to decrease the possibility of introducing an error from such processing. This restriction of the multiplexing and coding of the small voltage swing signal leads to an increase in the number of signal lines. In addition, since the above mentioned superconducting circuit has a small voltage/current gain, it has insufficient drivability. In order to compensate for the drivability of the superconducting circuit, the number of the signal lines further increases.

The stable transmission of the small voltage swing signal also requires a complete electromagnetic shield around the signal lines. The electromagnetic shield needs additional space.

The increase of the number of the signal lines and the attachment of the electromagnetic shield bring difficulties for realizing a highly integrated superconducting circuit.

SUMMARY OF THE INVENTION

Accordingly, it is an object of the present invention to provide an input interface circuit for a superconducting circuit which has overcome the above mentioned defect of the conventional one.

Another object of the present invention is to provide a superconducting interface circuit which transforms a signal sent by a normal circuit to a suitable signal for a superconducting circuit.

The above and other objects of the present invention are achieved in accordance with the present invention by a superconducting interface circuit converting a signal sent from a normal conducting circuit into a small voltage swing signal suitable for a superconducting circuit including a superconducting field effect device (abbreviated as super-FET hereinafter) having a superconducting channel of an extremely thin oxide superconductor thin film, a superconducting source region and a superconducting drain region of oxide superconductor thin films positioned at the both ends of the superconducting channel, and a gate electrode on the superconducting channel through a gate insulator, the gate electrode being connected to a signal line which transmits a voltage signal from the normal conducting circuit.

The superconducting interface circuit in accordance with the present invention can directly receive a signal of several volts sent by an ordinary electronic circuit, for example a CMOS circuit. Therefore, by using the superconducting interface circuit in accordance with the present invention, the signal transmission from the ordinary electronic circuit section to the superconducting section becomes stable and is not easily affected by an environmental electromagnetic field. In addition, multiplexing and coding of the signals become much easier.

By all of these, the number of signal lines between the ordinary electronic circuit section and the superconducting section can be reduced and an electromagnetic shield for the signal lines can be omitted so that a high packing arrangement becomes possible.

The super-FET utilized in the superconducting interface circuit has a superconducting channel of an extremely thin oxide superconductor. Superconducting current flowing through the superconducting channel is controlled by a signal voltage of several volts applied to a gate electrode arranged on the superconducting channel through a gate insulator. For example, if the superconducting channel of an oxide superconductor has a thickness of 5 nanometers, the gate can be closed by a voltage of 5 volts and superconducting current is completely shut off. Therefore, a signal voltage of 5 or 3.3 volts from a CMOS device can be directly sent to the gate electrode of the super-FET and can directly drive the super-FET. In addition, superconducting current of 10 mA can flow through the superconducting channel having a width of 100 $\mu$m.

This large current capability of the super-FET makes it possible for plural superconducting circuits to be connected to the superconducting interface circuit through a superconducting bus or a magnetic coupling.

It is preferable that the superconducting channel, superconducting source region and superconducting drain region of the above super-FET are formed of, for example, $Y_1Ba_2Cu_3O_{7-\delta}$ oxide superconductor material. In this connection, these superconducting regions are preferably formed of not only $Y_1Ba_2Cu_3O_{7-\delta}$ oxide superconductor material, but also a high-$T_c$ (high critical temperature) oxide superconductor material, particularly a high-$T_c$ copper-oxide type compound oxide superconductor material, for example, a Bi-Sr-Ca-Cu-O compound oxide superconductor material, and a Tl-Ba-Ca-Cu-O compound oxide superconductor material may be utilized. By using one of these oxide superconductors, cooling of a super-FET even operating under liquid nitrogen can be realized.

The above and other objects, features and advantages of the present invention will be apparent from the following description of preferred embodiments of the invention with reference to the accompanying drawings.

DESCRIPTION OF THE PREFERRED EMBODIMENTS

Figure 1:
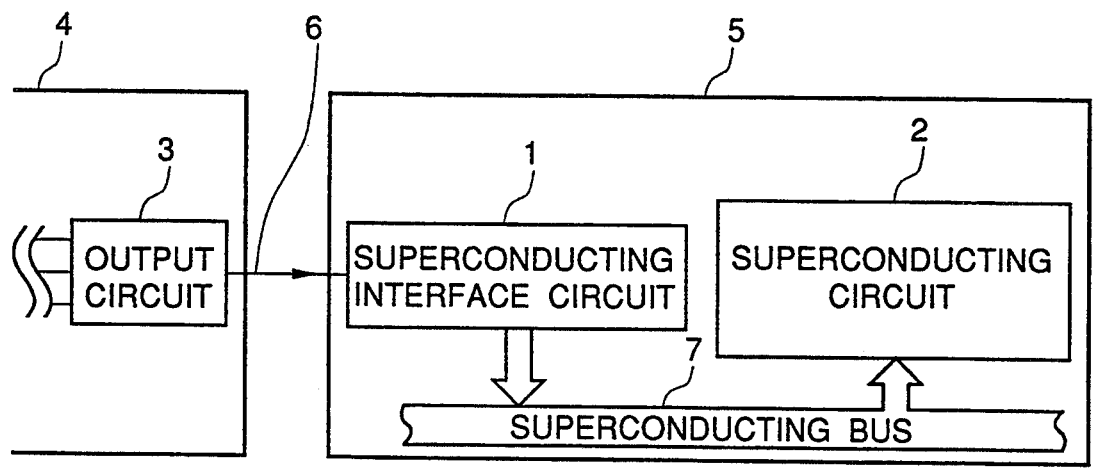
FIG. 1 is a block diagram of an embodiment of the electronic equipment including the superconducting interface circuit in accordance with the present invention.

Referring to FIG. 1, there is shown a diagram of an embodiment of an electronic equipment including the superconducting interface circuit in accordance with the present invention. The electronic equipment includes an ordinary semiconductor circuit 4 and a superconducting section 5 which are connected to each other by a signal line 6. The superconducting section 5 includes a superconducting interface circuit 1 in accordance with the present invention and a superconducting circuit 2, for example a superconducting signal processor, utilizing an oxide superconductor which is connected through a superconducting bus 7. As explained hereinafter, the superconducting bus 7 is driven by the superconducting interface circuit in accordance with the present invention. The entire superconducting section 5 is cooled by liquid nitrogen.

The ordinary circuit 4 includes an output circuit 3 utilizing a CMOS semiconductor device, which is connected to the superconducting interface circuit 1 by the signal line 6, precisely. A signal transmission along the signal line 6 has an output voltage level of 5.0 volts or 3.3 volts, which is produced by the CMOS semiconductor device of the output circuit 3. This ordinary voltage level signal is not easily disturbed by external electromagnetic fields. The signal is converted to a small voltage swing signal which is suitable for the superconducting circuit 2 by the superconducting interface circuit and is sent to the superconducting circuit 2 through the superconducting bus 7. Therefore, in the electronic equipment including the superconducting interface circuit 1 in accordance with the present invention, the small voltage swing signal is transmitted only in the superconducting section 5. Since it is easy to form a magnetic shield which covers the entire superconducting section 5 and this magnetic shield does not need such a large space, stable signal transmission from the ordinary circuit 4 to the superconducting section 5 and high density integration become possible in the electronic equipment.

Figure 2:
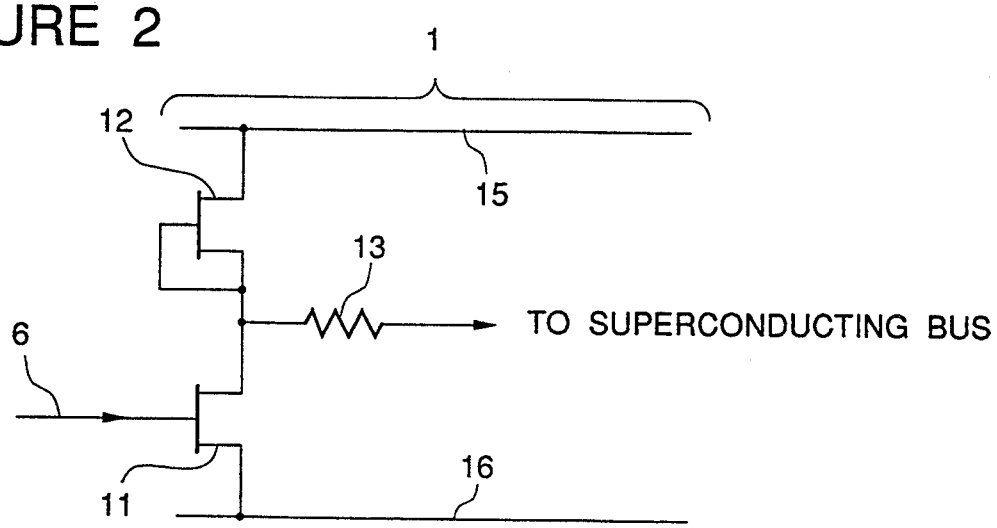
FIG. 2 is a schematic wiring diagram of an embodiment of the superconducting interface circuit in accordance with the present invention used in the electronic equipment shown in FIG. 1.

FIG. 2 shows a wiring diagram of an embodiment of the superconducting interface circuit which is used in the electronic equipment shown in FIG. 1. The superconducting interface circuit includes a first super-FET 11 which has a gate connected to the signal line 6, a source connected to the superconducting bus through a resister 13 and a drain connected to the ground line 16, and a second super-FET 12 which has a drain and gate connected to the superconducting bus through the resistor 13 and source connected to a power line 15. As explained in detail hereinafter, the super-FETs 11 and 12 have a large superconducting current capability and the flow of the superconducting current is controlled by a signal voltage of several voltages applied to their gates. Therefore, the signal transmitted along the signal line 6 of 5.0 volts or 3.3 volts can be converted to a small voltage swing signal suitable for the superconducting circuit 2 by this superconducting interface circuit.

Figure 3:
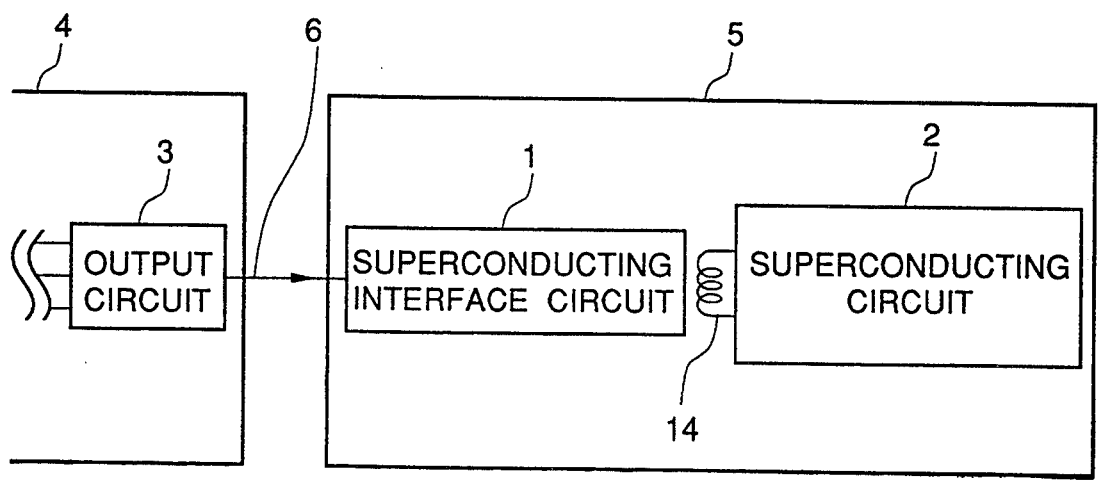
FIG. 3 is a block diagram of another embodiment of the electronic equipment including the superconducting interface circuit in accordance with the present invention.

FIG. 3 shows another embodiment of an electronic equipment including the superconducting interface circuit in accordance with the present invention. The electronic equipment includes an ordinary semiconductor circuit 4 and a superconducting section 5 which are connected to each other by a signal line 6 similarly to that of FIG. 1. The superconducting section 5 includes a superconducting interface circuit 1 in accordance with the present invention and a superconducting circuit 2 utilizing an oxide superconductor which are connected by a magnetic coupling utilizing a solenoid 14. This is the only difference of this electronic equipment from that of FIG. 1. Therefore, more explanation is abbreviated.

Figure 4:
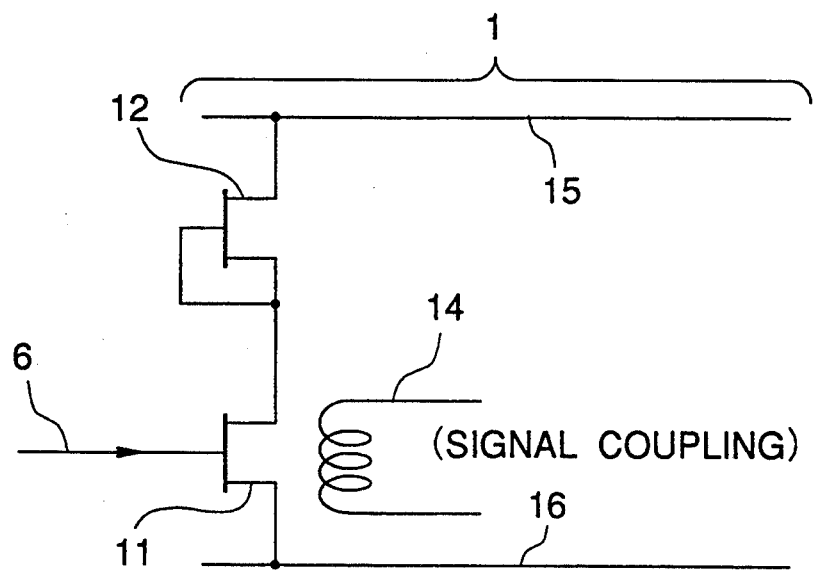
FIG. 4 is a schematic wiring diagram of another embodiment of the superconducting interface circuit in accordance with the present invention used in the electronic equipment shown in FIG. 3.

FIG. 4 shows a wiring diagram of an embodiment of the superconducting interface circuit which is used in the electronic equipment shown in FIG. 3. The superconducting interface circuit 1 has the same composition except that it does not include the resistor 13 and is not connected to the superconducting bus. As explained above, the superconducting interface circuit 1 is magnetically coupled to the superconducting circuit 2 by the solenoid 14, which is positioned near the super-FET 11.

Figure 5:
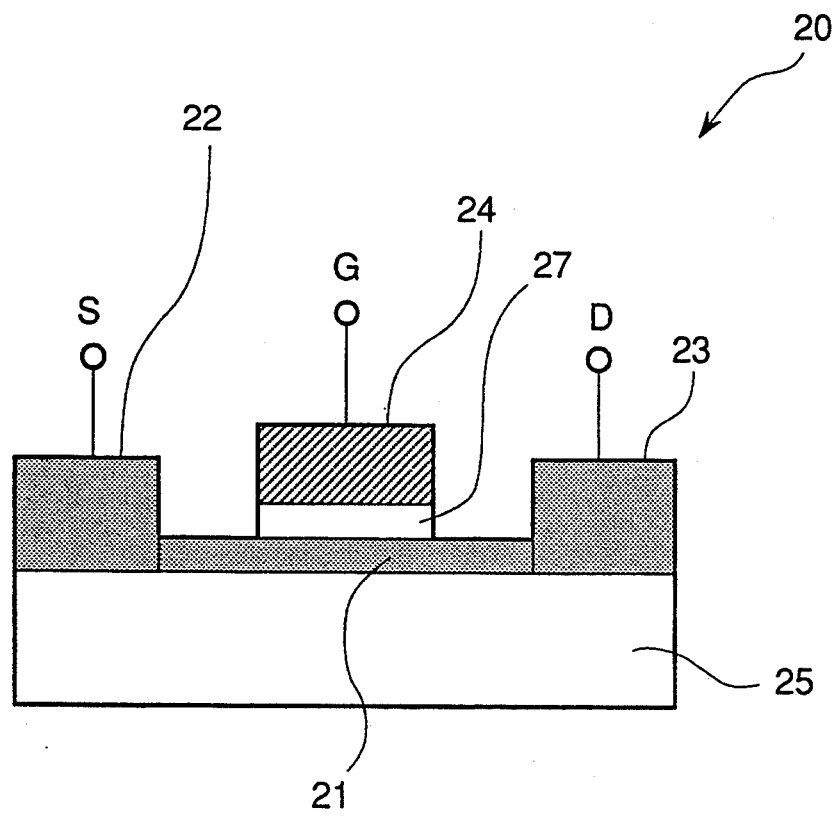
FIG. 5 is a schematic sectional view of a superconducting field effect device (super-FET) utilized in the superconducting interface circuit in accordance with the present invention.

FIG. 5 shows a schematic sectional view of an embodiment of a super-FET which is used in the superconducting interface circuit in accordance with the present invention. The super-FET 20 includes a substrate 25, a superconducting channel 21 of an oxide superconductor thin film having a thickness of on the order of 5 nanometers formed on the substrate, a superconducting source region 22 and a superconducting drain region 23 of an oxide superconductor thin film having a thickness of 200 nanometers formed at both ends of the superconducting channel 21. The super-FET further includes a gate electrode 24 on the superconducting channel 21 through a gate insulator 27. In the super-FET, superconducting current flowing through the superconducting channel 21 is controlled by a signal voltage of several volts applied to the gate electrode 24.

The super-FET has large current capability and current driving ability so that it can send superconducting signals to plural superconducting circuits through a superconducting bus or magnetic coupling.

It is preferable that the superconducting channel, superconducting source region and superconducting drain region of the above super-FET are formed of, for example, $Y_1Ba_2Cu_3O_{7-\delta}$ oxide superconductor material. In this connection, these superconducting regions are preferably formed of not only $Y_1Ba_2Cu_3O_{7-\delta}$ oxide superconductor material, but also a high-$T_c$ (high critical temperature) oxide superconductor material, particularly a high-$T_c$ copper-oxide type compound oxide superconductor material, for example a Bi-Sr-Ca-Cu-O compound oxide superconductor material, and a Tl-Ba-Ca-Cu-O compound oxide superconductor material.

As mentioned above, superconducting current flowing through the superconducting channel of the super-FET is controlled by a signal voltage of several volts applied to the gate electrode. Therefore, the signal can be directly sent from a CMOS device to the gate electrode of the super-FET. By using the superconducting interface circuit in accordance with the present invention, it becomes unnecessary to convert a signal into a small voltage swing signal suitable for a superconducting circuit before the signal is sent from a normal conducting circuit, so that the signal sent from the normal conducting circuit has an ordinary level. This makes it easy to send a multiplexed and coded signal from a normal conducting circuit to a superconducting circuit.

The invention has thus been shown and described with reference to the specific embodiments. However, it should be noted that the present invention is in no way limited to the details of the illustrated structures but changes and modifications may be made within the scope of the appended claims.

We claim:

1. A superconducting interface circuit converting a signal sent from a normal conducting circuit into a small voltage swing signal suitable for a superconducting circuit including a superconducting field effect device having a superconducting channel of an extremely thin oxide superconductor thin film, a superconducting source region and a superconducting drain region of oxide superconductor thin films positioned at the both ends of the superconducting channel, and a gate electrode on the superconducting channel through a gate insulator so as to control superconducting current flowing through the superconducting channel by a voltage applied to the gate electrode, the gate electrode being connected to a signal line which transmits a voltage signal from the normal conducting circuit.

2. A superconducting interface circuit claimed in claim 1 wherein the superconducting interface circuit is connected to the superconducting circuit through a superconducting bus.

3. A superconducting interface circuit claimed in claim 2 wherein the superconducting interface circuit includes a first superconducting field effect device of which the gate electrode being connected to the signal line which transmits a voltage signal from the normal conducting circuit, the superconducting source being connected to the superconducting bus through a resister and the superconducting drain being connected to the ground line, and a second superconducting field effect device of which the superconducting drain and the gate being connected to the superconducting bus through the resister and the superconducting source being connected to a power line.

4. A superconducting interface circuit claimed in claim 1 wherein the superconducting interface circuit is connected to the superconducting circuit through a magnetic coupling.

5. A superconducting interface circuit claimed in claim 4 wherein the superconducting interface circuit includes a first and a second superconducting field effect devices, the gate electrode of the first superconducting field effect device being connected to the signal line which transmits a voltage signal from the normal conducting circuit, the superconducting drain of the first superconducting field effect device being connected to the ground line, the superconducting source of the first superconducting field effect device being connected to the superconducting drain and the gate electrode of the second superconducting field effect device, and the superconducting source of the second superconducting field effect device being connected to a power line.

6. A superconducting interface circuit claimed in claim 1 wherein the oxide superconductor thin films of the superconducting field effect device are formed of a high critical temperature copper-oxide type oxide superconductor material.

7. A superconducting interface circuit claimed in claim 6 wherein the oxide superconductor thin films of the superconducting field effect device are formed of a material selected from the group consisting of a Y-Ba-Cu-O type compound oxide superconductor material, a Bi-Sr-Ca-Cu-O type compound oxide superconductor material, and a Tl-Ba-Ca-Cu-O type compound oxide superconductor material.

* * * * *